United States Patent [19]

Sterna et al.

[11] Patent Number: 4,782,664
[45] Date of Patent: Nov. 8, 1988

[54] THERMOELECTRIC HEAT EXCHANGER

[75] Inventors: Jaroslaw Sterna, Des Plaines; Samuel G. Boytor, Elgin, both of Ill.

[73] Assignee: Allied Products Corporation, Chicago, Ill.

[21] Appl. No.: 153,492

[22] Filed: Feb. 3, 1988

Related U.S. Application Data

[63] Continuation of Ser. No. 097,506, Sep. 16, 1987, abandoned.

[51] Int. Cl.$^4$ .............................................. F25B 21/02
[52] U.S. Cl. .............................................................. 62/3
[58] Field of Search ................................................. 62/3

[56] References Cited

U.S. PATENT DOCUMENTS

| | | | |
|---|---|---|---|
| 3,009,976 | 11/1961 | Wildi | 136/4 |
| 3,046,322 | 7/1962 | Wildi | 136/5 |
| 3,060,253 | 10/1962 | Wildi et al. | 136/5 |
| 3,077,079 | 2/1963 | Pietsch | 62/3 |
| 3,229,469 | 1/1966 | Katon | 62/3 |
| 3,283,520 | 11/1966 | Donohue et al. | 62/3 |
| 3,287,923 | 11/1966 | Elfving | 62/3 |
| 3,500,650 | 3/1970 | Mole | 62/3 |
| 3,733,836 | 5/1973 | Corini | 62/3 |
| 4,007,061 | 2/1977 | Le Couturier | 136/221 |
| 4,065,936 | 1/1978 | Fenton et al. | 62/3 |
| 4,281,516 | 8/1981 | Berthet et al. | 62/3 |

Primary Examiner—Lloyd L. King
Attorney, Agent, or Firm—Willian Brinks Olds Hofer Gilson & Lione

[57] ABSTRACT

A thermoelectric heat exchanger includes a first finned heat sink which includes at least two planar regions, at least two second heat sinks, each shaped to fit a respective one of the planar regions. At least two sets of thermoelectric cooling elements are provided, each set made up of three cooling elements arranged in a triangular pattern in a respective one of the planar regions between the first heat sink and the corresponding second heat sink. The cooling elements are connected together in series within each set and an electric voltage is applied in parallel across each of the sets of cooling elements. The second heat sinks are secured to the first heat sink to create a low thermal resistance contact between the cooling elements and the heat sinks, with each of the cooling elements establishing at least point contact with both of the respective heat sinks.

9 Claims, 2 Drawing Sheets

THERMOELECTRIC HEAT EXCHANGER

This application is a continuation of application Ser. No. 097,506, filed Sept. 16, 1987, now abandoned.

BACKGROUND OF THE INVENTION

This invention relates to an improved thermoelectric heat exchanger that provides high efficiency of operation.

Thermoelectric cooling elements have been commercially available for some time. Each element includes a large number of thermocouples which, when powered by a suitable electrical voltage, absorb heat on one surface of the cooling element and transfer it to an opposing surface.

Finned heat sinks are often provided for both surfaces of the thermoelectric cooling elements. In general, it is important to provide good thermal contact between the thermoelectric cooling elements and each of the heat sinks if operating efficiency is to be maximized.

One approach to this problem is that shown in FIGS. 2 and 3 of Katon U.S. Pat. No. 3,229,469. In this system, a common heat sink extends across multiple thermoelectric cooling elements on one side, while the heat sinks on the opposite side of the cooling elements are sized such that each heat sink engages only a single cooling element. This approach has the disadvantage of requiring a large number of heat sinks and suitable mounting devices for each heat sink.

The heat pump shown in Fenton U.S. Pat. No. 4,065,936 utilizes a larger number of thermoelectric cooling elements for each heat sink, but this approach can reduce operating efficiency. In particular, commercially available thermoelectric cooling elements vary in height, and when a large number of cooling elements are sandwiched between two opposed heat sinks, problems can be encountered in obtaining intimate contact between the heat sinks and each of the cooling elements.

Mole U.S. Pat. No. 3,500,650 shows another arrangement in which two pairs of thermoelectric cooling units are provided for each pair of heat exchangers. The disclosed structure connects all of the thermoelectric cooling elements in series, which can result in undesirably high voltage drops across some of the cooling elements and undesirably low voltage drops across others. Such variations in the voltage drops across separate ones of the cooling elements can materially decrease operating efficiency. Similarly, the heat pump shown in Le Couturier U.S. Pat. No. 4,007,061 utilizes a mosaic of thermoelectric elements which are clamped in place between opposed supporting elements. Variations in height between adjacent cooling elements can interfere with efficient thermal conduction between the cooling elements and the heat sinks.

It is an object of the present invention to provide an improved, high efficiency thermoelectric cooling unit which ensures excellent thermal contact between the individual cooling elements and the heat sinks, and which also ensures that the voltage drop across individual ones on the cooling unit elements do not vary excessively.

SUMMARY OF THE INVENTION

According to this invention, a thermoelectric heat exchanger is provided which comprises a first finned heat sink comprising at least two planar regions. At least two second finned heat sinks are provided, each shaped to fit over a respective one of the planar regions. A plurality of sets of thermoelectric cooling elements are provided, and each set is mounted in a respective one of the planar regions between the first heat sink and the respective one of the second heat sinks. The cooling elements in each set are electrically connected together, and the second heat sinks are secured to the first heat sink to create a low thermal resistance contact between the thermoelectric cooling elements and the heat sinks. Each set includes three cooling elements which are arranged in a triangular pattern. Because of the geometry of component elements, each of the cooling elements establishes at least point contact with both of the respective heat sinks. An electrical operating voltage is applied in parallel across each of the sets of thermoelectric elements.

The invention itself, together with further objects and attendant advantages, will best be understood by reference to the following detailed description, taken in conjunction with the accompanying drawings.

DETAILED DESCRIPTION OF THE PRESENTLY PREFERRED EMBODIMENTS

Figure 1:
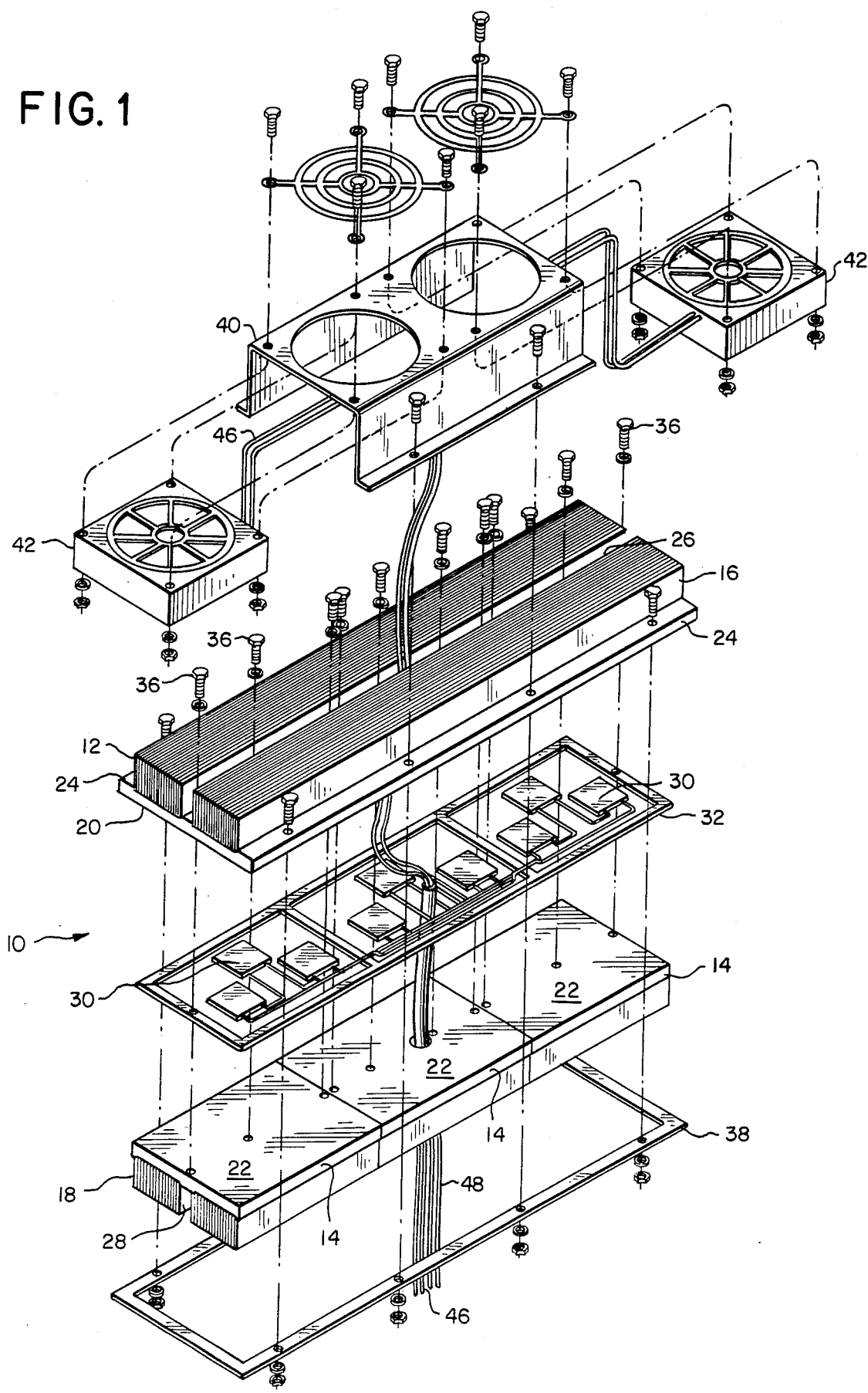
FIG. 1 is an exploded perspective view of a heat exchanger which incorporates a presently preferred embodiment of this invention.
Figure 2:
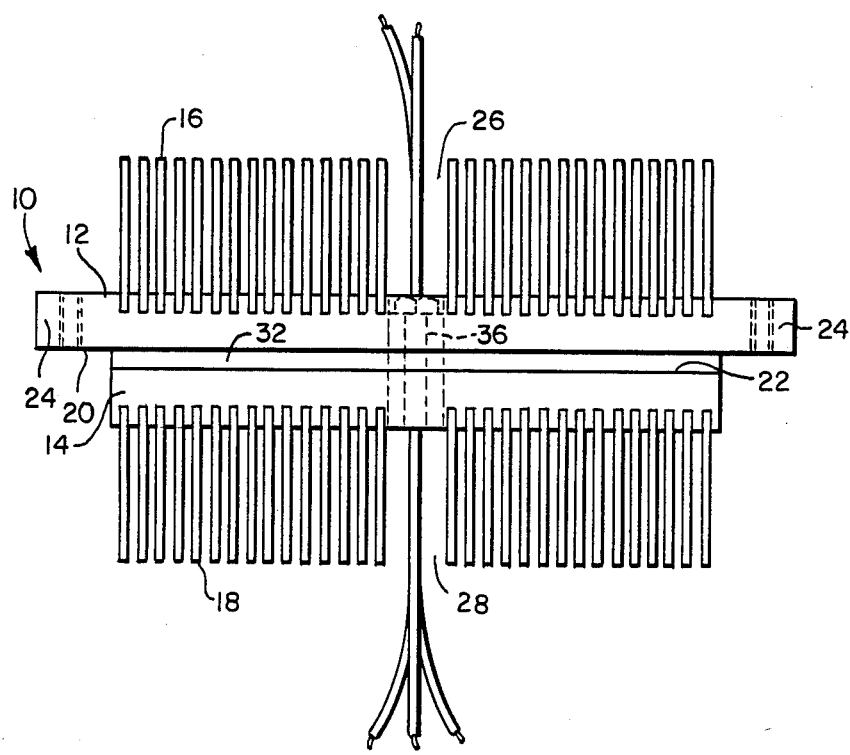
FIG. 2 is an end view of the heat exchanger of FIG. 1, prior to assembly of the fan bracket.

Turning now to the drawings, FIG. 1 shows an exploded perspective view of a heat exchanger 10 which incorporates a presently preferred embodiment of this invention. The heat exchanger 10 includes a first heat sink 12 which in this embodiment operates as the hot sink and a plurality of second heat sinks 14 which in this embodiment operate as the cold sinks. The first heat sink 12 defines an array of first fins 16, and the second heat sinks 14 each define a respective array of second fins 18. As shown in the drawings, the fins on all of the heat sinks are parallel and extend in an axial direction. The surface of the first heat sink 12 opposed to the first fins 16 is a planar first contact surface 20, and the surface of the second heat sinks 14 opposed to the second fins 18 is a second planar contact surface 22. In addition, the first heat sink 12 defines a pair of flanges 24, and each of the heat sinks 12, 14 defines a respective central axial strip 16, 28 within which the fins are absent.

Figure 4:
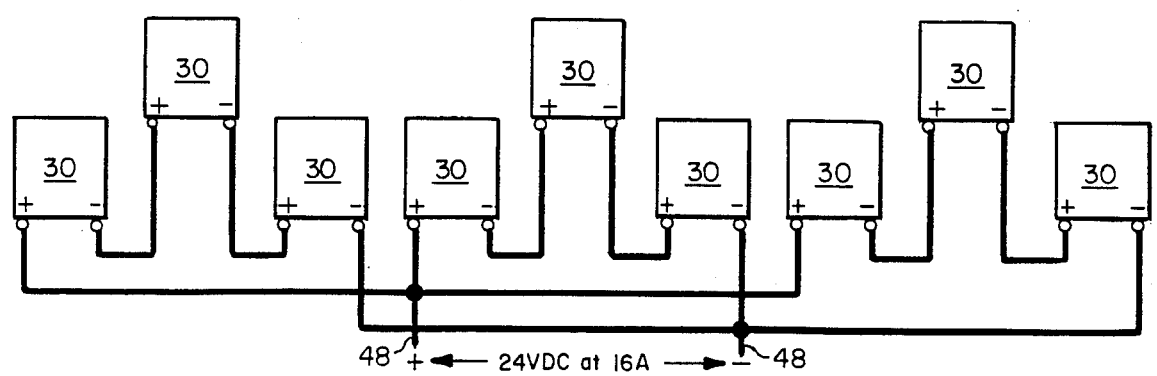
FIG. 4 is a schematic diagram showing electrical interconnections between cooling elements of the embodiment of FIG. 1.

As shown in FIG. 1, the heat exchanger 10 includes three sets of thermoelectric cooling elements 30, each made up of three separate cooling elements 30. Each set of cooling elements 30 is associated with a respective one of the second heat sinks 14. All three of the cooling elements 30 within any given set are electrically connected together in series, and the three sets of cooling elements 30 are connected together in parallel, as shown in FIG. 4. The cooling elements 30 are disposed between the first and second heat sinks 12, 14 in thermal contact with the first and second contact surface 20, 22.

A resilient gasket 32 surrounds each of the three sets of cooling elements 30 so as to create a sealed chamber for each set. The heat exchanger 10 is held together by means of fasteners 36 which are positioned in the strips 26, 28 and extend between the first heat sink 12 and the second heat sinks 14. A fastener 36 is provided between adjacent ones of the cooling elements 30, and these fasteners 36 securely hold the first and second contact surfaces 20, 22 in contact with the cooling elements 30. A mounting gasket 38 extends around the perimeter of the first contact surface 30 and is used for mounting the heat exchanger 10 in place.

The heat exchanger 10 includes a fan assembly which includes a fan mounting bracket 40 that is mounted to the first heat sink 12. A pair of fans 42 are mounted to the fan mounting bracket 40, and a pair of finger guards 44 are provided. The fans 42 are powered by AC voltages carried to the fans 42 by fan power conductors 46. The fans 42 are operated so as to force air down into the region between the first fins 16, so that cooling air flows from the central region of the first fins 16 toward each end of the first heat sink 12.

Power for the cooling elements 30 is provided by power conductors 48. As mentioned previously, the power conductors 48 apply the same voltage in parallel across each set of cooling elements 30. In this way, the voltage drop across any given one of the cooling elements 30 is maintained more nearly at the desired value. It has been found that significant improvements in efficiency result from this arrangement as compared with the conventional arrangement in which a large number of cooling elements are connected together in series.

The heat exchanger 10 described above provides unusually high operating efficiency, in part because of the manner in which the cooling elements 30 are circuited together. In addition, the arrangement of the cooling elements 30 and the heat sinks 12, 14 ensures that each of the cooling elements 30 is in at least point contact with each of the two respective heat sinks 12, 14. The three cooling units 30 within each set are arranged in a triangular pattern, and a fastener 36 is positioned in the region between the three cooling elements 30 of each set. Because the contact surfaces 20, 22 are planar, and because only three cooling elements 30 are positioned between each pair of contact surfaces 20, 22, excellent contact is obtained between the cooling elements 30 and the heat sinks 12, 14. As a practical matter, the cooling elements 30 will differ in height from one to another, and this height difference will often prevent area contact between both sides of each of the cooling elements 30 and the respective heat sinks 12, 14. However, at least point contact is ensured with the geometry described above. In order to enhance thermal conductivity between the cooling elements 30 and the heat sinks 12, 14, a conventional silicone grease is used in this region.

The gasket 32 is provided with grooves between adjacent ones of the second heat sinks 14, these grooves receive the conductors 34. As a further enhancement to operating efficiency, the grooves are filled in with a quantity of silicone rubber after assembly to insure that a seal is maintained around each pair of cooling elements 30.

Figure 3:
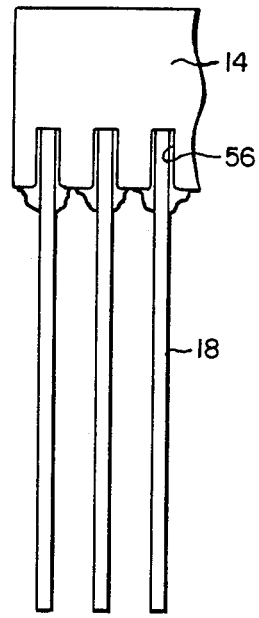
FIG. 3 is an enlarged fragmentary view showing the manner in which fins are mounted in place in the embodiment of FIG. 1.

Preferably, the fins 16, 18 are formed as separate metal plates which are adhesively secured in correspondingly shaped grooves 56 in the first and second heat sinks 12, 14. FIG. 3 shows a cross-sectional view illustrating the manner in which the fins 18 are retained in the grooves 56. It has been found that the use of such assembled fin structures for both the heat sinks 12, 14 materially enhances operating efficiency and reduces the overall size of the heat exchanger 10 as compared with conventional extruded fins.

The following information is provided in order better to define the best mode of the invention described above. It should be clearly understood that this information is provided only by way of illustration, and is in no way intended to limit the scope of the following claims.

In this embodiment, the thermoelectric cooling elements 30 can be embodied as modules CP1.4-127-045 marketed by Melcor Corporation. Each of these modules is made up of 127 thermocouples comprising elements of bismuth teluride semiconductors. The monitor 10 uses nine such cooling elements powered at 24VDC at 16 amps.

In order to maximize operating efficiency, the cooling elements 30 are carefully selected for uniformity and the heat sinks 12, 14 are carefully shaped to ensure intimate contact between heat sinks 12, 14 and the cooling elements 30. In particular, mechanical tolerances for the contact surfaces 20, 22 should not exceed 0.001 inch per inch with a maximum of 0.003 inches total excursion within any one of the regions in alignment with any set of cooling elements 30. The cooling elements 30 preferably do not vary one from another in height by more than $+/-0.00075$ inches with any given set. Series 120 silicone oil based thermal compound is used to eliminate minute air gaps between the cooling elements 30 and the contact surfaces 20, 22, and preferably the thickness of this thermal compound should be held within the range of 0.001 inches $+/-0.0005$ inches. Preferably, the gasket 32 is made of a closed cell polyurethane foam sealed with room temperature vulcanizing nonacidic rubber. Strain reliefs are preferably used for the conductors 46, 48 and fiber insulating washers should be preferably used with the fasteners 36. Bismuth/tin solder is preferably used to connect the conductors 34 with the thermoelectric cooling elements 30, and the fasteners 36 are preferably tightened to provide 15 inch pound of torque per fastener per square inch of cooling element area.

The materials used for the heat sinks 12, 14 and the fins 16, 18 should preferably be selected for high thermal conductivity. In this embodiment, the bodies of all of the heat sinks 12, 14 are formed from extruded three-eighths inch thick aluminum plate, preferably alloy 6061-T6. The fins 16, 18 in this embodiment are formed of 20 gauge aluminum sheet, preferably alloy 1100H-4. In this embodiment, the fins are adhesively secured in place in grooves in the heat sink bodies by an adhesive such as Wakefield Delta Bond 154 with C-4 hardener spread evenly along the entire length of each of the fins.

Of course, it should be understood that the preferred embodiment described above can be varied to suit the intended application. For example, the number of second heat sinks 14 and cooling elements 30 can be varied, depending on the desired capacity of the heat exchanger. By simply increasing or decreasing the number of second heat sinks 14 and correspondingly altering the length of the first heat sink 12, the heat exchanger 10 can readily be adapted to other applications. Furthermore, the size, shape, proportions and dimensions of the heat exchanger 10 can be varied as appropriate.

It is therefore intended that the foregoing detailed description be regarded as illustrative rather than limiting, and that it be understood that it is the following claims, including all equivalents, which are intended to define the scope of this invention.

We claim:

1. A thermoelectric heat exchanger comprising:
   a first finned heat sink comprising at least two planar regions;
   at least two second heat sinks, each shaped to fit over a respective one of the planar regions;
   a plurality of sets of thermoelectric cooling elements, each set made up of three cooling units arranged in a triangular pattern and mounted in a respective one of the planar regions between the first heat sink and the respective one of the second heat sinks;
   means for electrically connecting the cooling elements in each set together;
   means for securing each of the second heat sinks to the first heat sink to create a low thermal resistance contact between the cooling elements and the heat sinks, each of said cooling elements establishing at least point contact with both of the respective heat sinks; and
   means for applying an electrical voltage in parallel across each of the sets of cooling elements.

2. The invention of claim 1 further comprising at least one fan mounted centrally on the first heat sink to create an airflow from a central region of the first heat sink outwardly towards each end of the first heat sink.

3. The invention of claim 1 comprising a thermally conducting compound interposed between the cooling elements and the heat sinks to improve thermal conductivity therebetween.

4. The invention of claim 1 further comprising a gasket disposed between the first and second heat sinks and extending around each of the sets of cooling elements.

5. The invention of claim 1 wherein each of the heat sinks defines an array of parallel grooves and comprises an array of fins, each secured in a respective one of the grooves.

6. The invention of claim 1 wherein the first heat exchanger defines a central longitudinal axis, and wherein the securing means comprises an array of fasteners extending between the first and second heat sinks, said fasteners positioned on the longitudinal axis between adjacent ones of the cooling elements.

7. A thermoelectric heat exchanger comprising:
   a first heat sink having a first finned surface and an opposed planar first contacting surface, said first finned surface defining an array of first fins extending in an axial direction;
   a plurality of second heat sinks, each having a second finned surface and an opposed second planar contacting surface, said second finned surface defining an array of second fins extending in the axial direction;
   a plurality of sets of thermoelectric cooling elements, each of said sets made up of three cooling elements arranged in a triangular pattern and disposed between the second contacting surface of a respective one of the second heat sinks and the first contacting surface of the first heat sink;
   means for electrically connecting all three of the cooling elements within each set together in series;
   a gasket disposed between the first and second heat sinks and surrounding each set of cooling elements;
   a plurality of fasteners extending between the first and second heat sinks between adjacent ones of the cooling elements to ensure at least point contact between each of the cooling elements and both of the respective heat sinks;
   at least one fan centrally mounted over the first find to force cooling air from a central region of the first heat sink along the axial direction towards each end of the first heat sink; and
   means for applying an electrical voltage in parallel across each of the sets of cooling elements.

8. The invention of claim 7 wherein the first and second fins are mounted in respective grooves in the respective heat sinks.

9. The invention of claim 8 further comprising a thermally conducting compound interposed between the cooling elements and the heat sinks to improve thermal conductivity therebetween.

* * * * *

UNITED STATES PATENT AND TRADEMARK OFFICE
CERTIFICATE OF CORRECTION

PATENT NO. : 4,782,664

DATED : November 8, 1988

INVENTOR(S) : Jaroslaw Sterna et al.

It is certified that error appears in the above-identified patent and that said Letters Patent is hereby corrected as shown below:

<u>IN THE CLAIMS</u>

In column 6, line 28, please delete "find" and substitute therefor --fins--.

Signed and Sealed this

Eighth Day of October, 1991

Attest:

HARRY F. MANBECK, JR.

*Attesting Officer*     *Commissioner of Patents and Trademarks*